United States Patent [19]

Rink

[11] Patent Number: 5,262,636
[45] Date of Patent: Nov. 16, 1993

[54] PROXIMITY SENSOR APPARATUS FOR LASER DIODE

[75] Inventor: John L. Rink, San Francisco, Calif.
[73] Assignee: Diolase Corporation, Berkeley, Calif.
[21] Appl. No.: 877,746
[22] Filed: May 4, 1992
[51] Int. Cl.$^5$ ............................................. G01V 9/04
[52] U.S. Cl. ........................................ 250/221; 606/12
[58] Field of Search ................. 250/205, 221, 222.1, 250/560; 219/121.61, 121.62; 606/11, 12

[56] References Cited

U.S. PATENT DOCUMENTS

| | | | |
|---|---|---|---|
| 5,026,964 | 6/1991 | Somers et al. | 219/121.62 |
| 5,188,633 | 2/1993 | Kratzer et al. | 606/12 |
| 5,200,604 | 4/1993 | Rudko et al. | 606/12 |

FOREIGN PATENT DOCUMENTS

3245846A1  7/1983  Fed. Rep. of Germany ........ 606/12

Primary Examiner—Edward P. Westin
Assistant Examiner—K. Shami
Attorney, Agent, or Firm—Howard Cohen

[57] ABSTRACT

A proximity sensor apparatus for use with a laser diode device utilizes the photodiode mounted in the housing of the laser diode, and includes an electronic circuit coupled to the photodiode to monitor the output of the photodiode. When an object is closely adjacent to the output window of the laser diode, reflected light from the laser diode is transmitted retrograde through the output window and is received by the photodiode within the housing. The circuit of the invention establishes a threshold level for the photodiode current, determines the proximity of the reflecting object and permits (or prevents) operation of the laser diode. The circuit also includes a sampling timer to operate the laser diode for a very brief period (on the order of microseconds) each second, to ascertain if a target object is proximate to the laser diode output. The circuit is set to prevent laser operation, and operates the laser diode to emit a brief test pulse and determine the level of reflected laser light. If the reflected light level indicates that a target object is proximate, the circuit will switch on the laser diode, while continuing to monitor the photodiode current. If the reflected light level indicates that no target object is proximate, the laser diode will switch off, and the circuit will emit another brief test pulse after a delay of approximately one second. This process is reiterated.

8 Claims, 2 Drawing Sheets

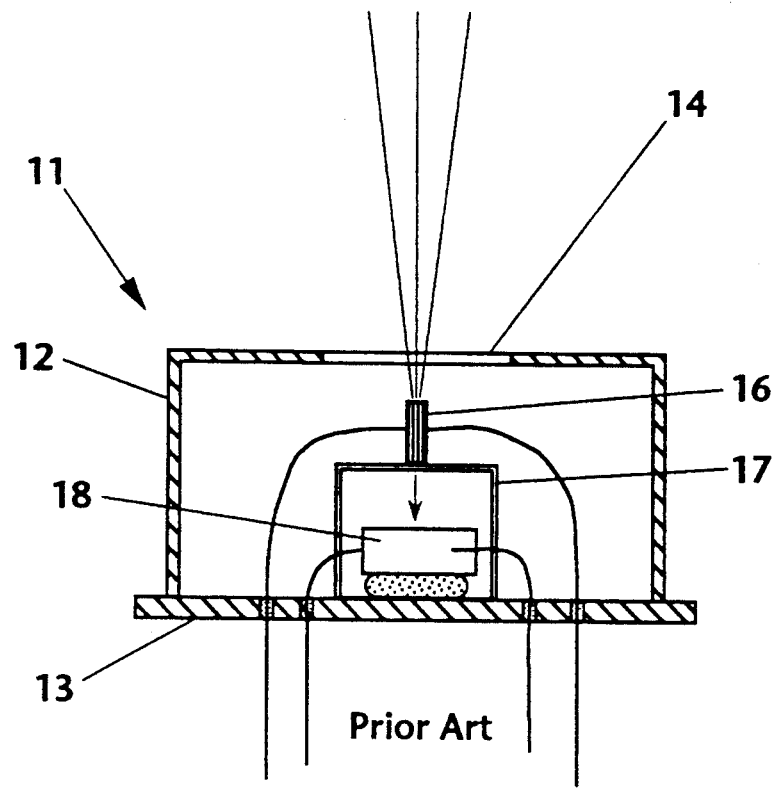
Figure_1
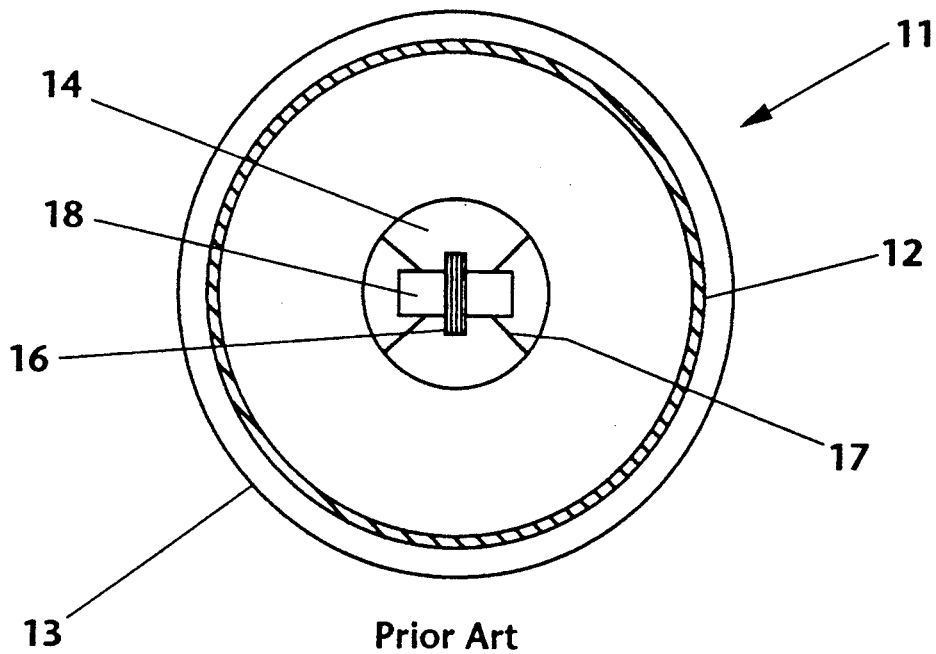
Figure_2

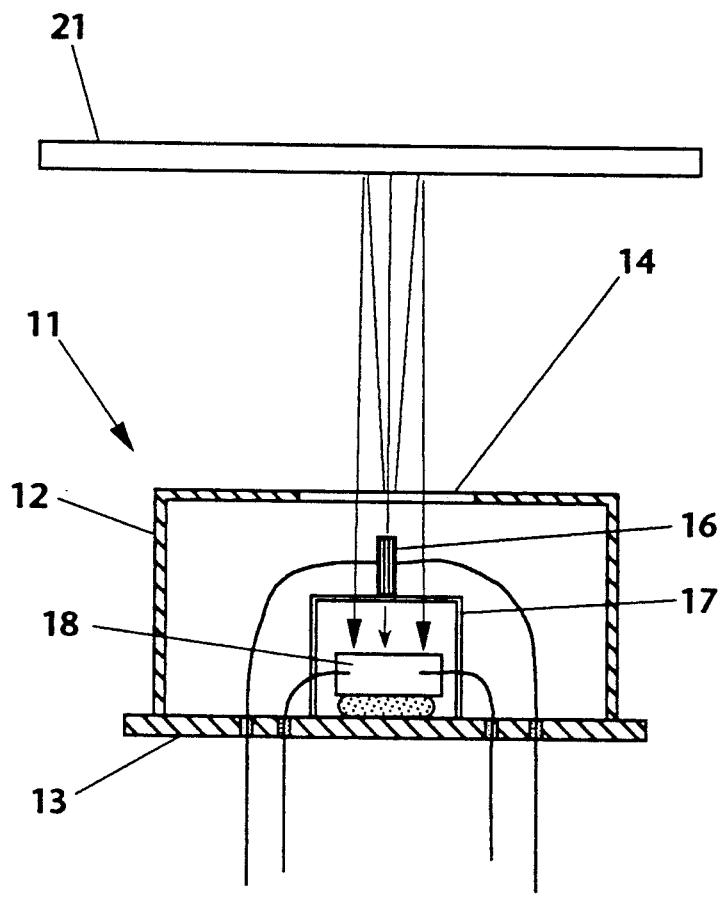
Figure_3
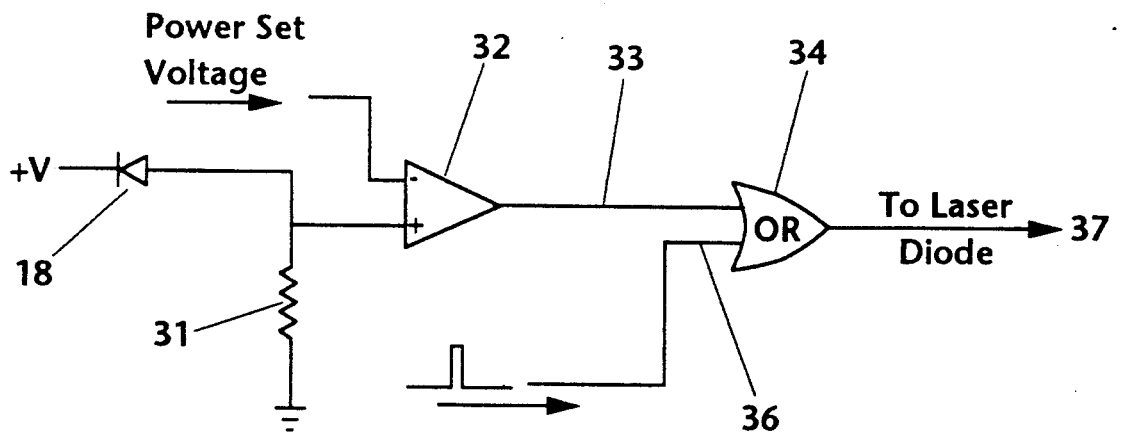
Figure_4

PROXIMITY SENSOR APPARATUS FOR LASER DIODE

BACKGROUND OF THE INVENTION

In the manufacturing and packaging of laser diodes, it is a common practice to place the laser diode in a standard electronic device housing such as a TO housing, and to include a photodiode or other photosensor within the housing. The laser diode device generally includes parallel mirror surfaces that define the resonant cavity of the laser, with one of the mirror surfaces totally reflective and the other, partially reflective mirror surface comprising the output of the laser diode. Although the one mirror surface is generally considered to be completely reflective, a small amount of the laser light is transmitted therethrough. The photodiode is placed adjacent to the totally reflective mirror surface to receive the light leaking through the mirror surface. The current through the photodiode is proportional to the output of the laser diode. The photodiode may be connected to an external circuit that controls the laser diode output, so that a feedback loop is established that very accurately controls the power output of the laser diode.

As development of laser diode devices has advanced in recent years, the maximum power output has increased markedly. Laser diodes are now sufficiently powerful to be used for medical treatment, such as, but not limited to, ophthalmic procedures, dental procedures, and irradiation of tissue for purposes of wound healing, pain relief, and anesthesia. A potential problem concomitant with the use of more powerful laser diode devices is that the beam projected by a device may pose a safety hazard, especially regarding the eyes of personnel in the general vicinity of laser use. This problem is compounded by the fact that most high power laser diodes currently available operate in the infrared band, and are not visible to the human eye. Therefor, it is essential that the laser diode device be directed toward an intended target, and be prevented from emitting a free beam that can cause harm at large distances.

It is an object of the invention to provide a proximity device to enable laser diode operation. It is a further object to utilize the photodiode generally included in the laser diode housing to form a proximity sensor. More specifically, an object of the invention is to detect whether or not an object is proximate to the output window of the laser diode, and to permit operation of the laser diode only when an object is sufficiently proximate to receive the laser output beam in point blank fashion.

SUMMARY OF THE PRESENT INVENTION

The present invention generally comprises a proximity sensor apparatus for use with a laser diode device to permit operation of the laser diode only when an object is sufficiently proximate to receive the laser output beam in point blank fashion. The apparatus utilizes the photodiode or similar device generally included in the housing of the laser diode, and includes an electronic circuit coupled to the photodiode to monitor the output of the photodiode. When an object is closely adjacent to the output window of the laser diode, reflected light from the laser diode is transmitted retrograde through the output window and is received by the photodiode within the housing. By establishing a threshold level for the photodiode current, the circuit of the invention determines the proximity of the reflecting object and permits (or prevents) operation of the laser diode.

The circuit also includes a sampling timer to operate the laser diode for a very brief period (on the order of microseconds) each second, to ascertain if a target object is proximate to the laser diode output. The circuit is set to prevent laser operation, and operates the laser diode to emit a brief test pulse and determine the level of reflected laser light. If the reflected light level indicates that a target object is proximate, the circuit will switch on the laser diode, while continuing to monitor the photodiode current. If the reflected light level indicates that no target object is proximate, the laser diode will remain off, and the circuit will emit another brief test pulse after a delay of approximately one second. This process will reiterate.

BRIEF DESCRIPTION OF THE DRAWING

FIG. 1 is a cross-sectional elevation of a typical prior art laser diode device.

FIG. 2 is a plan view of a typical prior art laser diode device.

FIG. 3 is a cross-sectional view of a laser diode device used in accordance with the present invention.

FIG. 4 is a schematic representation of the electronic circuit portion of the present invention.

DESCRIPTION OF THE PREFERRED EMBODIMENT

The present invention generally comprises a proximity sensor apparatus for use with a laser diode device to permit operation of the laser diode only when an object is sufficiently proximate to receive the laser output beam in point blank fashion. As shown in FIGS. 1 and 2, a laser diode device 11 known in the prior art generally comprises a cylindrical housing 12 sealed to a base plate 13. The housing 12 and base plate 13 define an enclosed space in which a laser diode device 16 is mounted on a support and heat sink 17. A window 14 disposed in the end wall of the cylindrical housing is provided to transmit the laser beam from the device 16.

The laser diode 16 generally includes a pair of spaced apart mirror surfaces which define the resonant cavity of the laser. The rear mirror is almost 100% reflective, so that generally all of the laser output is directed outward from the other, partially reflective mirror of the laser cavity. However, a small amount (<1%) of the laser energy does leak through the totally reflective mirror. A photodiode 18 or similar photosensor is disposed adjacent to the rear mirror to receive laser light from the rear mirror surface. The photodiode 18 may be electrically connected to a circuit which monitors the current through the photodiode. Due to the fact that the light transmitted through the rear mirror is proportional to the laser output through the front surface, the current through the photodiode 18 may be used to determine the laser output power. By connecting the photodiode to an appropriately designed external circuit which controls the current through the laser diode 16, the power output of the laser diode may be controlled very accurately.

The present invention makes use of the existing photodiode that is provided in a typical prior art laser diode assembly to provide a proximity detector function that controls the operation of the laser diode. As shown in FIG. 3, a reflective target object 21 that is placed in closely adjacent relationship to the window 14 will reflect a substantial portion of the laser output in retrograde fashion through the window 14 to impinge on the photodiode 18. The photodiode signal thus will represent a combination of the light from the rear surface of the laser diode device and the reflected light. However, due to the fact that the reflected light is much more powerful than the leakage light, the photodiode signal will change perceptibly when the target 21 is brought within a predetermined distance.

With regard to FIG. 4, the photodiode 18 is connected to a positive voltage source so that it will pass a current which is a known function of the laser output if none of the laser light is reflected back to the diode 18. The laser diode 16 produces laser light which is a known function of the current passing through the laser diode; therefor, the photodiode 18 current is a function of the current driven through the laser diode. The relationship of the photodiode current and the laser diode current can be approximated by a linear function. If the photodiode current is significantly higher than what would be expected for a known laser power, then it could be assumed that laser light is being reflected back into the laser diode housing by a target object 21 in close proximity to the output window of the laser diode device.

The photodiode 18 is connected to a resistor 31, which in turn is connected to ground. The voltage drop across the resistor 31 is proportional to the photodiode current; by proper choice of the resistor value, the voltage across the resistor may be scaled appropriately. (A potentiometer may be substituted for the resistor 31 to provide variable sensitivity, permitting selection of the threshold distance at which the reflecting object actuates the laser.) A comparator 32 has one input connected to the voltage across resistor 31, and the other input is connected to the voltage signal that drives the laser diode. If the voltage developed across the resistor 31 is higher than the voltage determining the laser power, then the comparator 32 switches high and allows the laser to continue operating. However, if the voltage developed across the resistor 31 is less than the voltage determining the laser power, then the comparator 32 switches low and prevents continued operation of the laser. It should be noted that a higher laser diode output power will cause a greater current in the photodiode 18, due to increased light transmission through the rear surface of the laser diode, as pointed out above. The comparison of the photodiode output with the laser diode input assures that only light reflected back into the laser diode housing will trigger the device.

The circuit also includes a sampling timer feature to determine if a target is proximate to the laser diode output window. The output 33 of the comparator 32 is connected to one input of an OR gate 34, and another input 36 of the OR gate is connected to a sampling clock pulse source. The sampling clock pulse source, which may comprise any form of timer circuit known in the prior art, is set to generate a brief pulse periodically and reiteratively. For example, the clock pulse may comprise a pulse of a few microseconds at a rate of one Hertz. The output 37 of the OR gate 34 is connected to an enable circuit that drives the laser diode, so that either the sampling pulse or the comparator output will cause the laser diode to operate. Thus the laser diode will operate at least once each second for an extremely brief period that is sufficient to determine if reflected laser light is received by the photodiode. If there is no reflection detected, the laser diode will be switched off by the lack of an output from the OR gate 34. If a reflection of the laser light occurs, the comparator output 33 will go high, the OR gate 34 output will remain high, and the laser diode will continue to operate.

The sampling pulse width may be adjusted so that the laser output during the sampling pulse does not comprise a safety hazard. For example, using a 100 milliwatt laser diode pulsed for 100 microseconds at one Hertz, the average power output is 10 microwatts, far below the threshold for eye damage. In contrast, 100 milliwatts of continuous laser energy can cause severe eye damage.

It should be noted that the circuit of the invention will turn off the laser diode immediately when the reflecting object is moved beyond a threshold distance at which the reflected light intensity no longer causes the comparator to generate an output.

I claim:

1. A proximity sensor for operating a laser diode device, including;
   photosensor means secured in said laser diode device, said photosensor means being disposed to receive laser diode light reflected from a target object proximate to said laser diode device;
   circuit means for receiving a signal from said photosensor means and detecting a portion of said signal corresponding to light received by said photosensor means due to reflection from a proximate target object and generating an actuating signal in response thereto;
   switch means connected to receive said actuating signal and enable operation of said laser diode, and
   said circuit means including sampling pulse means for operating said laser diode to emit a brief sampling pulse, said switch means maintaining operation of said laser diode when said actuating signal is received in response to said sampling pulse.

2. The proximity sensor of claim 1, wherein said sampling pulse means includes clock means for generating said brief sampling pulse periodically and reiteratively.

3. The proximity sensor of claim 2, wherein said sampling pulse means includes an OR gate having one input connected to said clock means, another input connected receive said actuating signal, and an output connected to said switch means.

4. The proximity sensor of claim 1, wherein said circuit means includes threshold detector means for detecting said portion of said signal corresponding to light received by said photosensor means due to reflection from a proximate target object.

5. The proximity sensor of claim 4, wherein said threshold detector means includes signal comparator means having one input connected to the signal from said photosensor means, another input connected to a power signal representing the output power of said laser diode device, and an output connected to said switch means.

6. An apparatus for operating a laser diode device, including;
   means for maintaining operation of said laser diode device only when a reflecting target is proximate to the output window of said laser diode device;
   means for immediately stopping operation of said laser diode device when a reflecting target is not proximate to said output window of said laser diode device, and
   sampling means for driving said laser diode device to emit a brief pulse, whereby said means for maintaining operation of said laser diode determines when a reflecting target is proximate to the output window of said laser diode device.

7. A method for operating a laser diode device having a monitor photodiode, including the steps of:
detecting a target object proximate to the output window of the laser diode by detecting light from the laser diode reflected by the target object to the monitor photodiode; including the steps of comparing the output signal of the monitor photodiode to a reference signal, and operating the laser diode device only when the monitor photodiode signal exceeds the reference signal to indicate that the monitor photodiode is receiving reflected laser light from a proximate target;
driving the laser diode device to generate a brief sampling pulse to determine if a target object is proximate to the output window of the laser diode; and
operating the laser diode device only when a target object is proximate to the output window of the laser diode device.

8. The method of claim 7, wherein said reference signal comprises a power signal corresponding to the output power of the laser diode.

* * * * *